(12) United States Patent
Kim et al.

(10) Patent No.: US 8,742,447 B2
(45) Date of Patent: Jun. 3, 2014

(54) LIGHT EMITTING DEVICE, LIGHT EMITTING DEVICE PACKAGE AND LIGHTING SYSTEM

(75) Inventors: Sun Kyung Kim, Seoul (KR); Woon Kyung Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 293 days.

(21) Appl. No.: 13/020,055

(22) Filed: Feb. 3, 2011

(65) Prior Publication Data

US 2011/0227110 A1    Sep. 22, 2011

(30) Foreign Application Priority Data

Mar. 22, 2010   (KR) .......................... 10-2010-0025075

(51) Int. Cl.
*H01L 31/02*    (2006.01)

(52) U.S. Cl.
USPC ............... 257/99; 257/E33.002; 257/E33.003

(58) Field of Classification Search
USPC ........ 257/98, 99, E33.062, E33.068, E33.072
See application file for complete search history.

(56) References Cited

U.S. PATENT DOCUMENTS

| | | | |
|---|---|---|---|
| 6,091,197 A * | 7/2000 | Sun et al. ........................ | 313/509 |
| 6,246,708 B1 * | 6/2001 | Thornton et al. .......... | 372/50.124 |
| 2002/0153845 A1 | 10/2002 | Lee et al. .................... | 315/169.3 |
| 2005/0104078 A1 | 5/2005 | Cheng et al. .................... | 257/98 |
| 2005/0152417 A1 * | 7/2005 | Lin .................... | 372/43 |
| 2006/0055850 A1 * | 3/2006 | Murata et al. .................. | 349/113 |
| 2006/0278883 A1 * | 12/2006 | Negley .................... | 257/98 |
| 2007/0115415 A1 * | 5/2007 | Piehl et al. .................... | 349/137 |
| 2008/0197369 A1 * | 8/2008 | Batres et al. .................... | 257/98 |
| 2010/0025704 A1 * | 2/2010 | Wang et al. .................... | 257/98 |

FOREIGN PATENT DOCUMENTS

| | | |
|---|---|---|
| JP | 2005-514015 A | 5/2005 |
| JP | 2005-197650 A | 7/2005 |
| JP | 2006-120913 A | 5/2006 |
| KR | 10-2002-0081947 A | 10/2002 |
| KR | 10-2008-0017180 A | 2/2008 |
| KR | 10-0866789 B1 | 11/2008 |

* cited by examiner

*Primary Examiner* — Theresa T. Doan
*Assistant Examiner* — Sarah Salerno
(74) *Attorney, Agent, or Firm* — KED & Associates LLP

(57) ABSTRACT

Disclosed are a light emitting device, a light emitting device package, and a lighting system. The light emitting device includes a light emitting structure including a first conductive semiconductor layer, an active layer and a second conductive semiconductor layer; a substrate over the light emitting structure; a first reflective layer having a plurality of dielectric layers including a first dielectric layer having a first refractive index over the substrate, and a second dielectric layer having a second refractive index different from the first refractive index over the first dielectric layer; and a second reflective layer over the first reflective layer, the second reflective layer having a refractive index lower than the refractive index of each dielectric layer of the first reflective layer.

20 Claims, 6 Drawing Sheets

LIGHT EMITTING DEVICE, LIGHT EMITTING DEVICE PACKAGE AND LIGHTING SYSTEM

CROSS-REFERENCE TO RELATED APPLICATION

This application claims under 35 U.S.C. §119 to Korean Patent Application No. 10-2010-0025075 filed Mar. 22, 2010, which is hereby incorporated by reference.

BACKGROUND

The embodiment relates to a light emitting device, a light emitting device package, and a lighting system.

A light emitting device (LED) includes a p-n junction diode having a characteristic of converting electric energy into light energy. The p-n junction diode can be formed by combining group III and group V elements of the periodic table. The LED can represent various colors by adjusting the compositional ratio of compound semiconductors.

When forward voltage is applied to the LED, electrons of an n layer are combined with holes of a p layer, so that energy corresponding to an energy gap between a conduction band and a valance band may be generated. This energy is realized as heat or light, and the LED emits the energy in the form of light.

A nitride semiconductor represents superior thermal stability and wide bandgap energy so that the nitride semiconductor has been spotlighted in the field of optical devices and high-power electronic devices. In particular, blue, green, and UV light emitting devices employing the nitride semiconductor have already been developed and extensively used.

The LED is divided into a lateral type LED and a vertical type LED according to the position of an electrode.

In the lateral type LED, a light emitting structure is formed on a thermal conductive substrate and two electrode layers are aligned over the light emitting structure.

Meanwhile, in the lateral type LED, a thick thermal conductive substrate is located at a lower end of the light emitting structure and a great amount of light is emitted through a lateral side of an insulating substrate, the function of a reflective layer located at a lower end of the insulating substrate is very important.

However, according to the related art, the reflective layer located at the lower end of the insulating substrate is includes a metal layer which represents weak reliability. That is, the reflectance of the metal layer may be degraded as time elapses, so that quantity of the light may be reduced.

BRIEF SUMMARY

The embodiment provides a light emitting device, a light emitting device package, and a lighting system, capable of representing superior reflectance without degrading the reliability.

A light emitting device according to the embodiment includes a light emitting structure including a first conductive semiconductor layer, an active layer and a second conductive semiconductor layer; a substrate over the light emitting structure; a first reflective layer having a plurality of dielectric layers including a first dielectric layer having a first refractive index over the substrate, and a second dielectric layer having a second refractive index different from the first refractive index over the first dielectric layer; and a second reflective layer over the first reflective layer, the second reflective layer having a refractive index lower than the refractive index of each dielectric layer of the first reflective layer.

A light emitting device package according to the embodiment includes a package body; an electrode layer over the package body; and a light emitting device of claim 1 electrically connected to the electrode layer.

A lighting system according to the embodiment includes a substrate; and a light emitting module including the light emitting device package over the substrate.

DETAILED DESCRIPTION OF THE EMBODIMENTS

Hereinafter, a light emitting device, a light emitting device package, and a lighting system according to the embodiments will be described in detail with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

(Embodiments)

Figure 1:
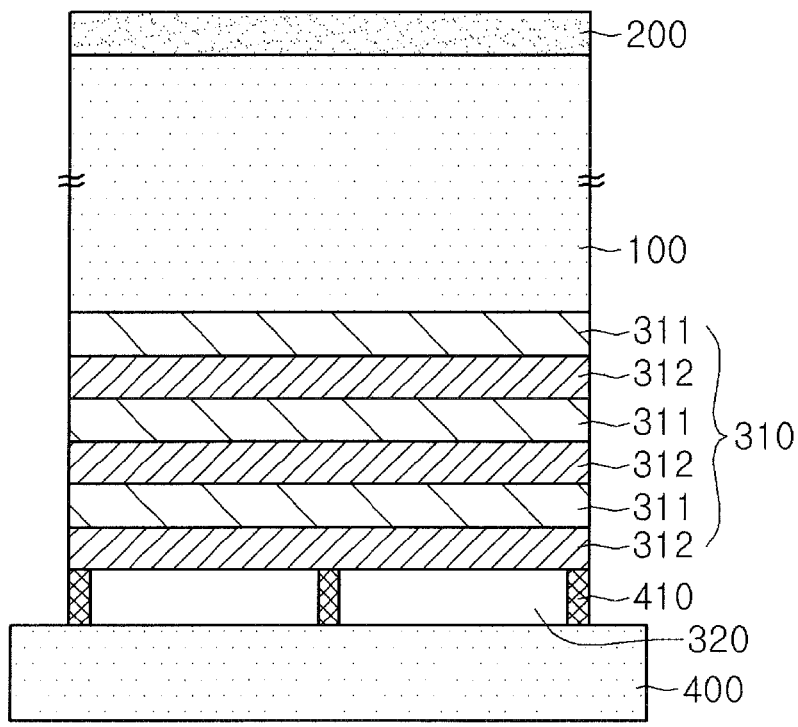
FIG. 1 is a sectional view showing a light emitting device according to the first embodiment.

FIG. 1 is a sectional view of a light emitting device package including a light emitting device according to the first embodiment.

Figure 7:
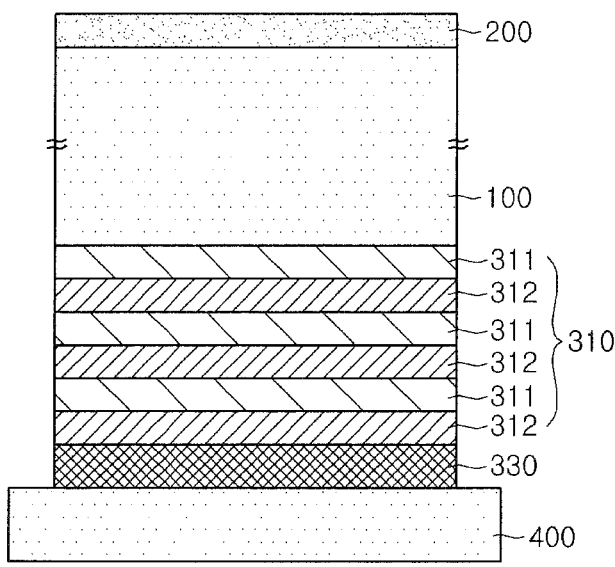
FIG. 7 is a sectional view showing a light emitting device according to the second embodiment.

FIG. 7 is a sectional view showing a light emitting device package including a light emitting device according to the second embodiment.

The light emitting device 250 (see, FIG. 5) according to the first embodiment may include a light emitting structure 200 formed on a substrate 100, a first reflective layer 310 including a plurality of dielectric layers under the substrate 100, and a second reflective layer 320 formed under the first reflective layer 310 and having a refractive index lower than that of the first reflective layer 310.

The light emitting device package 500 according to the first embodiment may include a light emitting structure 200 formed on a substrate 100, a first reflective layer 310 including a plurality of dielectric layers under the substrate 100, a second reflective layer 320 formed under the first reflective layer 310 and having a refractive index lower than that of the first reflective layer 310, a support layer 410 on the first reflective layer 410 and a sub-mount 400 under the support layer 410.

According to the first embodiment, the second reflective layer 320 may include an air layer.

According to the first embodiment, the first reflective layer 310 including the dielectric layers may include a first dielectric layer 311 having a first refractive index and a second dielectric layer 312 formed under the first dielectric layer 311 and having a second refractive index different from the first refractive index. The first and second dielectric layers 311 and 312 can be repeatedly formed as a stack structure.

The thickness of the first and second dielectric layers 311 and 312 may be $\lambda/(4n \times \cos\theta)$, wherein $\lambda$ is a wavelength of light, n is a refractive index of each dielectric layer, and $\theta$ is an incident angle of light with respect to the substrate in the range of 0° to 25°.

According to the light emitting device, the method of manufacturing the same, and the light emitting device package of the embodiment, the reflective layer is prepared as a combination of dielectric layers and a layer having a refractive index lower than that of the dielectric layer is formed under the dielectric layer, so that reflective layer may represent reflectance higher than that of the metal layer according to the related art without degrading the reliability.

In general, the lower reflective layer of the lateral type light emitting device includes a metal having high reflectance, such as Ag or Al. If the lower reflective layer includes Ag, the lower reflective layer represents reflectance of 90% or above regardless of the incident angle and polarizing status of the light.

However, according to the related art, a thin metal layer including Ni or Pt is required in order to reinforce the adhesion strength between sapphire and a metal reflective layer. Since the metal layer serving as an adhesion reinforcing layer represents the high absorption rate, the reflectance is lowered exponentially proportional to the deposition thickness. In addition, the reflectance of the metal reflective layer may be extremely changed depending on the roughness of the sapphire substrate. Thus, the actual reflectance of the metal reflective layer is more lowered.

Figure 2:
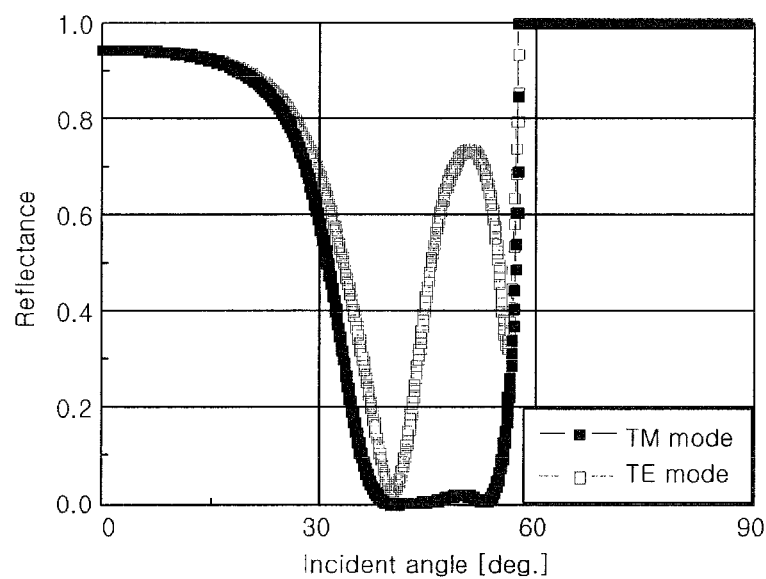
FIG. 2 is a graph showing variation of reflectance of a light emitting device according to the comparative example.
Figure 3:
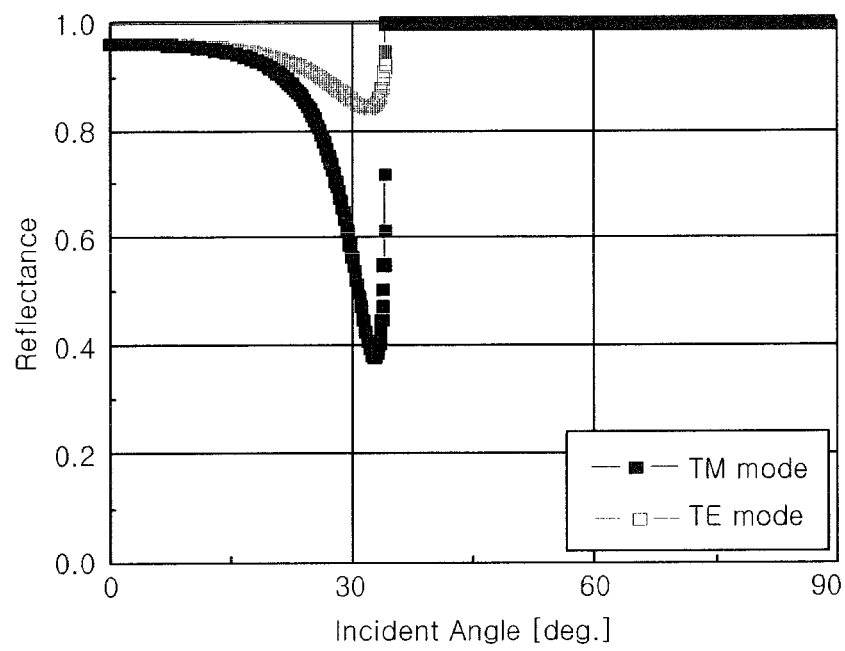
FIG. 3 is a graph showing variation of reflectance of a light emitting device according to the embodiment.

FIG. 2 is a graph showing variation of reflectance of a light emitting device according to the comparative example, and FIG. 3 is a graph showing variation of reflectance of a light emitting device according to the embodiment.

FIG. 2 shows the reflectance when the reflective layer is used as the dielectric layer. That is, FIG. 2 shows variation of the reflectance according to the incident angle when four reflective layers are stacked by using $SiO_2/TiO_2$. At this time, the refractive index of the background material behind the reflective layers is 1.5.

FIG. 3 shows the reflectance when the reflective layer is used as the dielectric layer. That is, FIG. 3 shows variation of the reflectance according to the incident angle when four reflective layers are stacked by using $SiO_2/TiO_2$. At this time, the refractive index of the background material behind the reflective layers is 1.0.

In FIGS. 2 and 3, the TM mode and the TE mode represent the TE polarization mode and TM polarization mode, respectively.

For instance, if the light generated from the light emitting device has the electromagnetic wave, the electric field (E-field) and the magnetic field (M-field) of the electromagnetic wave may perpendicularly cross each other.

At this time, if the E-field of the wave is transverse to the boundary plane (XZ plane) and perpendicular to the incident plane (XY plane), the wave is referred to as a transverse electric wave or a TE polarization wave, which is an E-polarized wave.

In addition, if the M-field of the wave is transverse to the boundary plane (XZ plane), the wave is referred to as a transverse magnetic wave or a TM polarization wave, which is an M-polarized wave.

According to the embodiment, the first reflective layer includes a plurality of dielectric layers which are repeatedly stacked with different refractive indexes.

According to the embodiment, the second reflective layer 320 having the refractive index similar to that of air is formed under the lowermost layer of the first reflective layer 310 to allow the first reflective layer 310 to have the reflectance characteristic similar to that of the metal reflective layer.

For instance, if an $SiO_2$ layer having the refractive index of 1.46 with respect to the blue wavelength of 450 nm, and a $TiO_2$ layer having the refractive index of 2.44 with respect to the blue wavelength of 450 nm are repeatedly stacked under the sapphire substrate in the form of the quarter-wave stack ($\lambda/4n$), the higher reflectance can be obtained proportionally to the number of stacks as shown in FIG. 3.

However, if the lowest reflective layer has the refractive index similar to that of the $SiO_2$ layer, the reflectance may be lowered at the specific incident angle as shown in FIG. 2.

In order to solve the above problem, as shown in FIG. 1, the second reflective layer 320, which is the air layer, is provided as the lowest layer of the reflective layer. Otherwise, as shown in FIG. 7, the material having the refractive index similar to that of air is formed at the lowest layer of the reflective layer to recover the reflectance as shown in FIG. 3.

Therefore, the second reflective layer 330 having the refractive index similar to that of air is bonded to the bottom of the first reflective layer as shown in FIG. 7, or the support layer 410 is provided on the sub-mount such that the first reflective layer 310 can be supported on the air layer serving as the second reflective layer 320.

Figure 4:
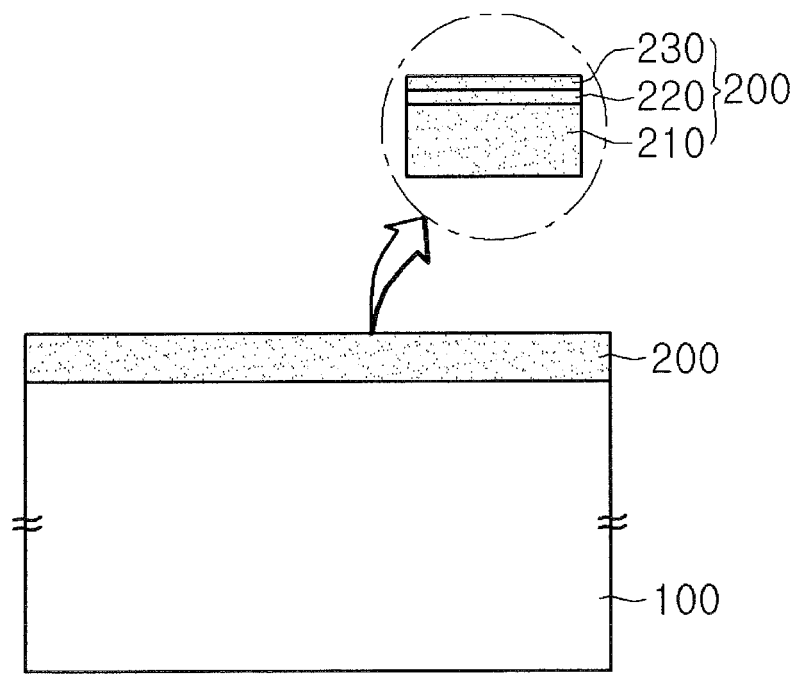
FIGS. 4 to 6 are sectional views showing the procedure for manufacturing a light emitting device according to the first embodiment.

Hereinafter, the method of manufacturing the light emitting device according to the first embodiment will be described with reference to FIGS. 4 to 6.

The light emitting device according to the embodiment may include GaN, GaAs, GaAsP, or GaP. For instance, Green~Blue LEDs may include GaN (InGaN) and Yellow~Red LEDs may include InGaAlP or AlGaAs. The full-color light emitting device can be realized by changing the composition of the material.

First, the light emitting structure 200 is formed on the substrate 100.

The substrate 100 may include at least one of $Al_2O_3$, SiC, Si, GaAs, GaN, ZnO, Si, GaP, InP, Ge, and $Ga_2O_3$. In addition, the wet etching is performed with respect to the substrate 100 to remove impurities from the surface of the substrate 100.

Then, the light emitting structure 200 including the first conductive semiconductor layer 210, the active layer 220 and the second conductive semiconductor layer 230 is formed on the substrate 100.

The first conductive semiconductor layer 210 may include a group III-V compound semiconductor doped with a first conductive dopant. If the first conductive semiconductor layer 210 is an N type semiconductor layer, the first conductive dopant is an N type dopant, such as Si, Ge, Sn, Se, or Te, but the embodiment is not limited thereto.

The first conductive semiconductor layer 210 may include the semiconductor material having the compositional formula of $In_xAl_yGa_{1-x-y}N$ ($0 \leq x \leq 1$, $0 \leq y \leq 1$, $0 \leq x+y \leq 1$).

The first conductive semiconductor layer 210 may include at least one selected from the group consisting of GaN, InN, AlN, InGaN, AlGaN, InAlGaN, AlInN, AlGaAs, InGaAs, AlInGaAs, GaP, AlGaP, InGaP, AlInGaP, and InP.

The first conductive semiconductor layer 210 may include an N type GaN layer, which is formed through the CVD, MBE, sputtering or HVPE. In addition, the first conductive semiconductor layer 210 can be formed by injecting trimethyl gallium (TMGa) gas, ammonia ($NH_3$) gas, nitrogen ($N_2$) gas and silane ($SiH_4$) gas including n type impurities, such as silicon, into the chamber.

A buffer layer (not shown) can be formed on the substrate 100. The buffer layer may attenuate lattice mismatch between the light emitting structure 200 and the substrate 100. The buffer layer may include a group III-V compound semiconductor. For instance, the buffer layer may include at least one of GaN, InN, AlN, InGaN, AlGaN, InAlGaN, and AlInN. An undoped semiconductor layer can be formed on the buffer layer, but the embodiment is not limited thereto.

The active layer 220 emits the light having energy determined based on the intrinsic energy band of the active layer (light emitting layer) 220 through the recombination of electrons injected through the first conductive semiconductor layer 210 and holes injected through the second conductive semiconductor layer 230.

The active layer 220 may include at least one of a single quantum well structure, a multiple quantum well (MQW) structure, a quantum wire structure or a quantum dot structure. For instance, the active layer 220 can be prepared as the MQW structure by injecting TMGa gas, $NH_3$ gas, $N_2$ gas, and trimethyl indium (TMIn) gas, but the embodiment is not limited thereto.

The active layer 220 may have a pair structure of well/barrier layers including at least one of InGaN/GaN, InGaN/InGaN, GaN/AlGaN, InAlGaN/GaN, GaAs(InGaAs)/AlGaAs and GaP(InGaP)/AlGaP, but the embodiment is not limited thereto. The well layer may include a material having the bandgap lower than that of the barrier layer.

A conductive clad layer (not shown) can be formed on and/or under the active layer 220. The conductive clad layer may include an AlGaN-based semiconductor having the bandgap higher than that of the active layer 220.

The second conductive semiconductor layer 230 includes the group III-V compound semiconductor doped with the second conductive dopant. For instance, the second conductive semiconductor layer 230 may include the semiconductor material having the compositional formula of $In_xAl_yGa_{1-x-y}N$ ($0 \le x \le 1$, $0 \le y \le 1$, $0 \le x+y \le 1$). In detail, the second conductive semiconductor layer 230 may include one selected from the group consisting of GaN, AlN, AlGaN, InGaN, InN, InAlGaN, AlInN, AlGaAs, GaP, GaAs, GaAsP, and AlGaInP. If the second conductive semiconductor layer 230 is a P type semiconductor layer, the second conductive dopant includes the P type dopant such as Mg, Zn, Ca, Sr, or Ba. The second conductive semiconductor layer 230 can be prepared as a single layer or a multiple layer, but the embodiment is not limited thereto.

The second conductive semiconductor layer 230 may include a p type GaN layer, which can be formed by injecting TMGa gas, $NH_3$ gas, $N_2$ gas and ($EtCp_2Mg$) {Mg($C_2H_5C_5H_4)_2$} gas including p type impurities (for example, Mg) into the chamber, but the embodiment is not limited thereto.

According to the embodiment, the first conductive semiconductor layer 210 may include an N type semiconductor layer and the second conductive semiconductor layer 230 may include a P type semiconductor layer, but the embodiment is not limited thereto. In addition, a semiconductor layer, such as an N type semiconductor layer (not shown) having polarity opposite to that of the second conductive semiconductor layer 230, can be formed on the second conductive semiconductor layer 230. Thus, the light emitting structure 200 may include one of an N—P junction structure, a P—N junction structure, an N—P—N junction structure, and a P—N—P junction structure.

Figure 5:
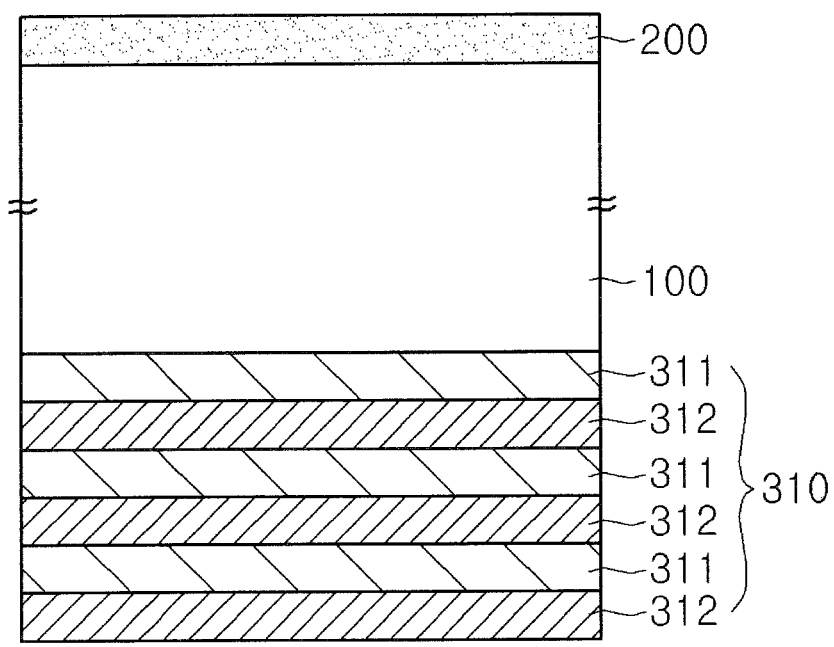

After that, as shown in FIG. 5, the first reflective layer 310 having a plurality of dielectric layers is formed under the substrate 100. According to the embodiment, a plurality of dielectric layers can be repeatedly stacked at the low end of the first reflective layer 310.

The step of forming the first reflective layer 310 having the plural dielectric layers may include the steps of forming a first dielectric layer 311 having a first refractive index, and forming a second dielectric layer 312 having a second refractive index different from the first refractive index under the first dielectric layer 311.

The refractive index of the first dielectric layer 311 may be lower than the refractive index of the second dielectric layer 312 or the substrate 100, but the embodiment is not limited thereto. If the refractive index of the first dielectric layer 311 is lower than the refractive index of the substrate 100, the light incident into the substrate 100 is totally reflected between the substrate 100 and the first dielectric layer 311 so that the light is reflected to the outside, thereby improving the reflectance.

The thickness of the first and second dielectric layers 311 and 312 may be $\lambda/(4n \times \cos\theta)$, wherein $\lambda$ is a wavelength of light, n is a refractive index of each dielectric layer, and $\theta$ is an incident angle of light with respect to the substrate in the range of 0° to 25°.

In addition, the first and second dielectric layers 311 and 312 may be alternately stacked plural times.

For instance, if the first dielectric layer 311 including the $SiO_2$ layer having the refractive index of 1.46 with respect to the blue wavelength of 450 nm, and the second dielectric layer 312 including the $TiO_2$ layer having the refractive index of 2.44 with respect to the blue wavelength of 450 nm are repeatedly stacked under the sapphire substrate 100 in the form of the quarter-wave stack ($\lambda/4n$), the higher reflectance can be obtained proportionally to the number of stacks, but the embodiment does not limit the material and the number of the dielectric layers.

Figure 6:
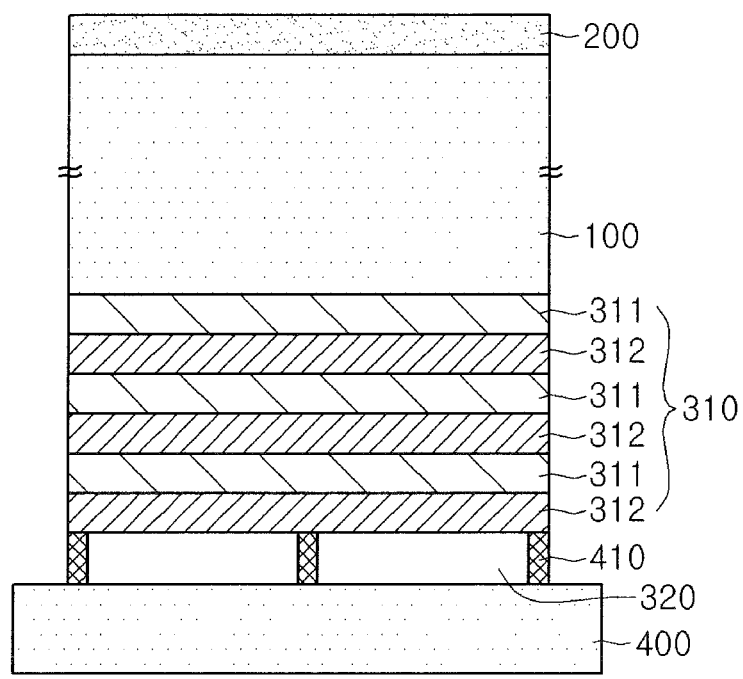

Then, as shown in FIG. 6, the second reflective layer 320 having the refractive index lower than that of the first reflective layer 310 is formed under the first reflective layer 310.

For instance, the support layer 410 is interposed between the first reflective layer 310 and the sub-mount 400 and the light emitting device chip is attached to the sub-mount 400, thereby forming the second reflective layer 320 having the refractive index lower than that of the first reflective layer 310 under the first reflective layer 310.

If the refractive index of the lowest layer of the first reflective layer 310 is similar to that of the first reflective layer, the reflectance may be lowered at the specific incident angle.

In order to solve the above problem, the second reflective layer 320 having the refractive index similar to that of air is formed under the lowermost layer of the first reflective layer 310 to allow the first reflective layer 310 to have the reflectance characteristic similar to that of the metal reflective layer.

That is, as shown in FIG. 6, the support layer 410 is provided on the sub-mount 400 such that the reflective layer 310 can be supported on the air layer.

In this case, the support layer 410 may include a metallic material, such as Cu or Au, but the embodiment is not limited thereto. Due to the support layer 410, the second reflective layer 320 may be prepared as the air layer.

The sub-mount 400 has the thermal expansion coefficient similar to that of the light emitting structure 200 and the superior thermal conductivity. According to the embodiment, the sub-mount 400 may include silicon (Si), but the embodiment is not limited thereto.

The light emitting device chip can be attached to the sub-mount by using a polymer adhesive, but the embodiment is not limited thereto.

For instance, the light emitting device chip can be attached to the sub-mount 400 by soldering Ag conductive epoxy. In addition, the light emitting device chip can be attached to the sub-mount 400 through the eutectic bonding scheme if the high thermal conductivity is necessary, but the embodiment is not limited thereto.

According to the light emitting device, the method of manufacturing the same, and the light emitting device package of the first embodiment, the reflective layer of the lateral type light emitting device is prepared as the combination of the dielectric layers, and the layer having the refractive index lower than that of the dielectric layer is formed under the dielectric layer, so that the reflective layer has the reflectance higher than that of the metal reflective layer according to the related art without degrading the reliability.

FIG. 7 is a sectional view showing a light emitting device according to the second embodiment.

The second embodiment may adopt the technical features of the first embodiment.

According to the second embodiment, as shown in FIG. 7, the second reflective layer 320 having the refractive index between refractive indexes of air and the first reflective layer 310 (for example, similar to that of air) is formed under a plurality of dielectric layers serving as the first reflective layer 310. The second reflective layer 330 may include at least one of spin-on-glass and $MgF_2$, but the embodiment is not limited thereto.

According to the light emitting device, and the light emitting device package of the second embodiment, the reflective layer of the lateral type light emitting device is prepared as the combination of the dielectric layers, and the layer having the refractive index lower than that of the dielectric layer is formed under the dielectric layer, so that the reflective layer has the reflectance higher than that of the metal reflective layer according to the related art without degrading the reliability.

Figure 8:
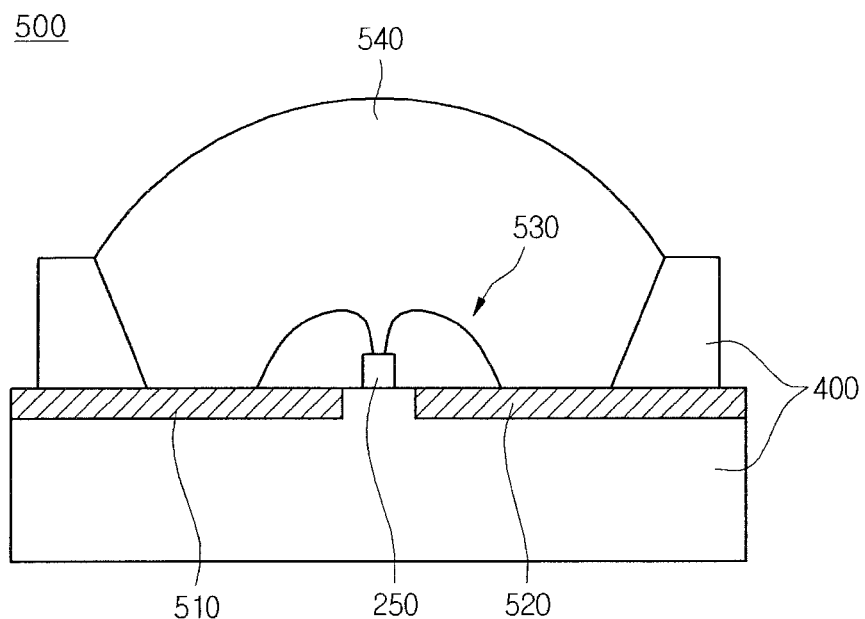
FIG. 8 is a sectional view showing a light emitting device package according to the embodiment.

FIG. 8 is a view showing a light emitting device package 500 including the light emitting device according to the embodiments.

Referring to FIG. 8, the light emitting device package 500 includes a body (sub-mount) 400, third and fourth electrode layers 510 and 520 formed on the body 400, the light emitting device 250 provided on the body 400 and electrically connected to the third and fourth electrode layers 510 and 520 and a molding member 540 that surrounds the light emitting device 250.

The body 400 may include silicon, synthetic resin or metallic material. An inclined surface may be formed around the light emitting device 250.

The third and fourth electrode layers 510 and 520 are electrically isolated from each other to supply power to the light emitting device 250. In addition, the third and fourth electrode layers 510 and 520 reflect the light emitted from the light emitting device 250 to improve the light efficiency and dissipate heat generated from the light emitting device 250 to the outside.

The lateral type light emitting device shown in FIG. 1 or 7 can be employed as the light emitting device 250, but the embodiment is not limited thereto. For instance, the vertical type light emitting device can be used as the light emitting device 250.

The light emitting device 250 can be installed on the body 400 or the third or fourth electrode layer 510 or 520.

The light emitting device 250 may be electrically connected to the third electrode layer 510 and/or the fourth electrode layer 520 through a wire 530. Although the embodiment illustrates the lateral type light emitting device 250 and two wires 530, the embodiment is not limited thereto.

The molding member 540 surrounds the light emitting device 250 to protect the light emitting device 250. In addition, the molding member 540 may include luminescent materials to change the wavelength of the light emitted from the light emitting device 250.

The light emitting device package according to the embodiment can be employed in a lighting system. The lighting system may include a lighting unit shown in FIG. 9 and a backlight unit shown in FIG. 10. In addition, the light system may include a signal lamp, a headlight of a vehicle and a signboard.

Figure 9:
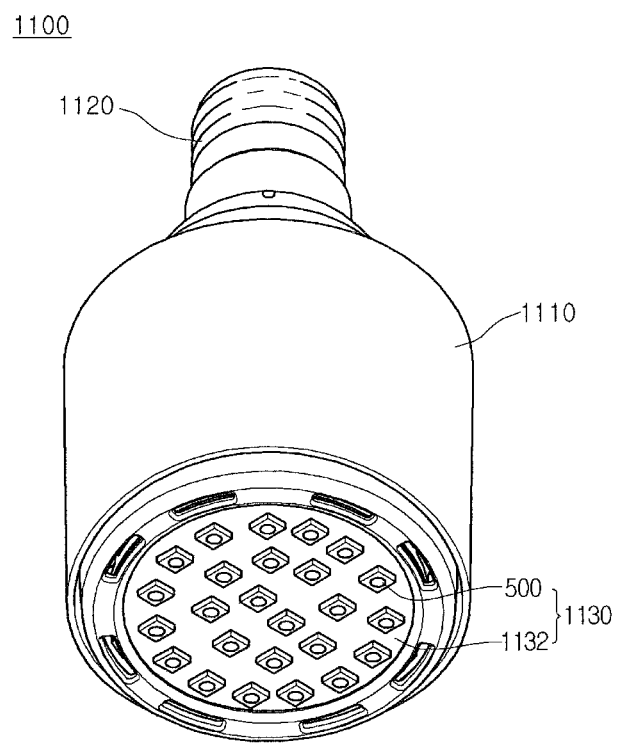
FIG. 9 is a perspective view showing a lighting unit according to the embodiment.

FIG. 9 is a perspective view showing a lighting unit 1100 according to the embodiment.

Referring to FIG. 9, the lighting unit 1100 includes a case body 1110, a light emitting module 1130 installed in the case body 1110, and a connection terminal 1120 installed in the case body 1110 to receive power from an external power source.

Preferably, the case body 1110 includes material having superior heat dissipation property. For instance, the case body 1110 includes metallic material or resin material.

The light emitting module 1130 may include a substrate 1132 and at least one light emitting device package 500 installed on the substrate 1132.

The substrate 1132 includes an insulating member printed with a circuit pattern. For instance, the substrate 1132 includes a PCB (printed circuit board), an MC (metal core) PCB, a flexible PCB, or a ceramic PCB.

In addition, the substrate 1132 may include material that effectively reflects the light. The surface of the substrate 1132 can be coated with a predetermined color, such as a white color or a silver color, to effectively reflect the light.

At least one light emitting device package 500 can be mounted on the substrate 1132. Each light emitting device package 500 may include at least one LED (light emitting diode). The LED may include a colored LED that emits the light having the color of red, green, blue or white and a UV (ultraviolet) LED that emits UV light.

The light emitting device packages 500 of the light emitting module 1130 can be arranged in various configurations to provide various colors and brightness. For instance, the white LED, the red LED and the green LED can be combined to achieve the high color rendering index (CRI).

The connection terminal 1120 is electrically connected to the light emitting module 1130 to supply power to the light emitting module 1130. Referring to FIG. 9, the connection terminal 1120 has a shape of a socket screw-coupled with the external power source, but the embodiment is not limited thereto. For instance, the connection terminal 1120 can be prepared in the form of a pin inserted into the external power source or connected to the external power source through a wire.

Figure 10:
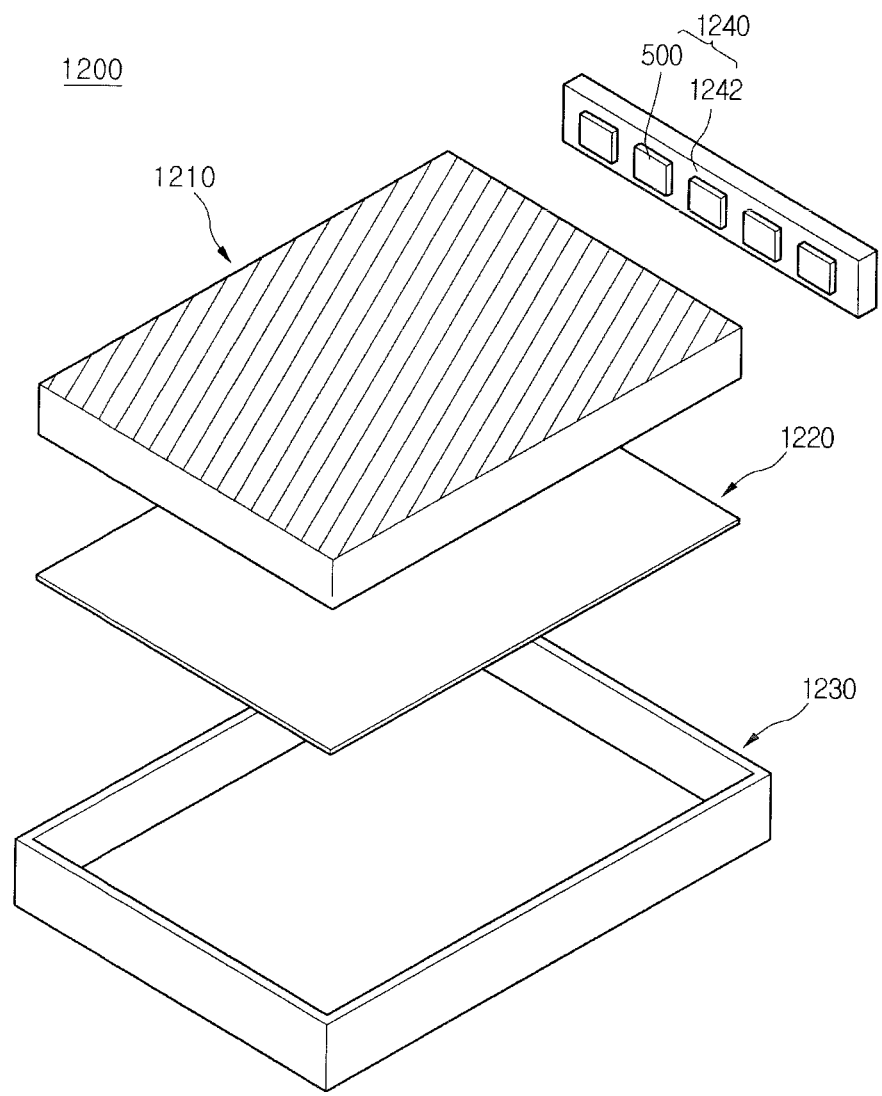
FIG. 10 is an exploded perspective view showing a backlight unit according to the embodiment.

FIG. 10 is an exploded perspective view showing a backlight unit 1200 according to the embodiment.

The backlight unit 1200 according to the embodiment includes a light guide plate 1210, a light emitting module 1240 for providing the light to the light guide plate 1210, a reflective member 1220 positioned below the light guide plate 2110, and a bottom cover 1230 for receiving the light guide plate 1210, light emitting module 1240, and the reflective member 1220 therein, but the embodiment is not limited thereto.

The light guide plate 1210 diffuses the light to provide surface light. The light guide 1210 includes transparent material. For instance, the light guide plate 1210 can be manufactured by using acryl-based resin, such as PMMA (polymethyl methacrylate), PET (polyethylene terephthalate), PC (polycarbonate), COC(cycloolefin copolymer) or PEN (polyethylene naphthalate) resin.

The light emitting module 1240 supplies the light to the lateral side of the light guide plate 1210 and serves as the light source of the display device including the backlight unit.

The light emitting module 1240 can be positioned adjacent to the light guide plate 1210, but the embodiment is not limited thereto. In detail, the light emitting module 1240 includes a substrate 1242 and a plurality of light emitting device packages 500 installed on the substrate 1242 and the substrate 1242 can be adjacent to the light guide plate 1210, but the embodiment is not limited thereto.

The substrate 1242 may include a printed circuit board (PCB) having a circuit pattern (not shown). In addition, the substrate 1242 may also include a metal core PCB (MCPCB) or a flexible PCB (FPCB), but the embodiment is not limited thereto.

In addition, the light emitting device packages 500 are arranged on the substrate 1242 such that light exit surfaces of the light emitting device packages 500 are spaced apart from the light guide plate 1210 by a predetermined distance.

The reflective member 1220 is disposed below the light guide plate 1210. The reflective member 1220 reflects the light, which is travelled downward through the bottom surface of the light guide plate 1210, toward the light guide plate 1210, thereby improving the brightness of the backlight unit. For instance, the reflective member 1220 may include PET, PC or PVC resin, but the embodiment is not limited thereto.

The bottom cover 1230 may receive the light guide plate 1210, the light emitting module 1240, and the reflective member 1220 therein.

To this end, the bottom cover 1230 has a box shape with an open top surface, but the embodiment is not limited thereto.

The bottom cover 1230 can be manufactured through a press process or an extrusion process by using metallic material or resin material.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device comprising:
   a light emitting structure including a first conductive semiconductor layer, an active layer and a second conductive semiconductor layer;
   a substrate under the light emitting structure;
   a first reflective layer having a plurality of dielectric layers including a first dielectric layer having a first refractive index under the substrate, and a second dielectric layer having a second refractive index different from the first refractive index under the first dielectric layer, the first reflective layer having a bottom most surface;
   a second reflective layer under the first reflective layer, the second reflective layer having a refractive index lower than the refractive index of each dielectric layer of the first reflective layer;
   a support layer under the first reflective layer, the sub-mount having a top most surface; and
   a sub-mount under the support layer, wherein the support layer is disposed between the bottom most surface of the first reflective layer and the sub-mount,
   wherein the top most surface of the support layer is disposed under the bottom most surface of the first reflective layer.

2. The light emitting device of claim 1, wherein each of the different regions of the second reflective layer has a refractive index at least substantially equal to a refractive index of air.

3. The light emitting device of claim 1, wherein a thickness of the first and second dielectric layers is $\lambda/(4n \times \cos\theta)$, in which $\lambda$ is a wavelength of light, n is a refractive index of each dielectric layer, and $\theta$ is an incident angle of light with respect to the substrate in a range of 0° to 25°.

4. The light emitting device of claim 1, wherein the refractive index of the first dielectric layer is lower than the refractive index of the second dielectric layer.

5. The light emitting device of claim 4, wherein the refractive index of the first dielectric layer is lower than a refractive index of the substrate.

6. The light emitting device of claim 1, wherein the first and second dielectric layers are alternately stacked plural times.

7. The light emitting device of claim 2, wherein the support layer comprises a metallic material.

8. A light emitting device package comprising:
   a package body;
   an electrode layer over the package body; and
   a light emitting device of claim 1 electrically connected to the electrode layer.

9. A lighting system comprising:
   a substrate; and
   a light emitting module including a light emitting device package of claim 8 over the substrate.

10. The light emitting device of claim 1, wherein the light emitting structure is formed on an upper side of the substrate, and wherein the first reflective layer is formed on a bottom side of the substrate.

11. The light emitting device of claim 10, wherein the second reflective layer is formed under a bottom side of the first reflective layer.

12. The light emitting device of claim 1, wherein:
   the second reflective layer has a plurality of sections spaced from one another, at least one section of the support layer extends from the sub-mount to contact the bottom surface of the first reflective layer, and each of the sections of the second reflective layer includes an air layer.

13. The light emitting device of claim 12, wherein at least two sections of the second reflective layer are substantially a same size.

14. The light emitting device of claim 12, wherein all the sections of the second reflective layer are substantially a same size.

15. The light emitting device of claim 1, wherein the support layer is separated from both the first reflective layer and the second reflective layer.

16. The light emitting device of claim 1, wherein the second reflective layer is surrounded by the first reflective layer, the support layer, and the sub-mount.

17. The light emitting device of claim 1, wherein the second reflective layer is between a plurality of support layers.

18. The light emitting device of claim 1, wherein the second reflective layer is in direct contact with the sub-mount.

19. The light emitting device of claim 1, wherein the first dielectric layer has a lower refractive index than a refractive index of the second dielectric layer and wherein the second reflective layer has a lower refractive index than the refractive index of the first dielectric layer.

20. The light emitting device package of claim 8, wherein the second reflective layer is surrounded by the first reflective layer, the support layer, and the sub-mount.

\* \* \* \* \*